United States Patent
Masukawa et al.

(10) Patent No.: US 11,971,660 B2
(45) Date of Patent: Apr. 30, 2024

(54) CROSS-LINKED POLYMER FOR RESIST

(71) Applicant: MARUZEN PETROCHEMICAL CO., LTD., Tokyo (JP)

(72) Inventors: Tomohiro Masukawa, Ichihara (JP); Masataka Nojima, Ichihara (JP)

(73) Assignee: Maruzen Petrochemical Co., Ltd., Tokyo (JP)

( * ) Notice: Subject to any disclaimer, the term of this patent is extended or adjusted under 35 U.S.C. 154(b) by 409 days.

(21) Appl. No.: 17/310,865

(22) PCT Filed: Sep. 30, 2020

(86) PCT No.: PCT/JP2020/037078
§ 371 (c)(1),
(2) Date: Aug. 27, 2021

(87) PCT Pub. No.: WO2021/065982
PCT Pub. Date: Apr. 8, 2021

(65) Prior Publication Data
US 2022/0135726 A1    May 5, 2022

(30) Foreign Application Priority Data
Oct. 2, 2019   (JP) ................. 2019-182460

(51) Int. Cl.
| | | |
|---|---|---|
| *G03F 7/039* | (2006.01) | |
| *C08F 257/00* | (2006.01) | |
| *C08G 8/36* | (2006.01) | |
| *G03F 7/004* | (2006.01) | |
| *G03F 7/038* | (2006.01) | |
| *G03F 7/16* | (2006.01) | |
| *G03F 7/32* | (2006.01) | |

(52) U.S. Cl.
CPC .......... *G03F 7/0392* (2013.01); *C08F 257/00* (2013.01); *C08G 8/36* (2013.01); *G03F 7/004* (2013.01); *G03F 7/0045* (2013.01); *G03F 7/038* (2013.01); *G03F 7/162* (2013.01); *G03F 7/32* (2013.01)

(58) Field of Classification Search
CPC .............................. G03F 7/0392; G03F 7/039
See application file for complete search history.

(56) References Cited

U.S. PATENT DOCUMENTS

| | | | |
|---|---|---|---|
| 4,898,916 A | | 2/1990 | Gupta |
| 5,876,900 A | * | 3/1999 | Watanabe ............ G03F 7/0392 430/905 |
| 5,959,051 A | | 9/1999 | Kaneko et al. |
| 6,060,213 A | * | 5/2000 | Kodama ............... G03F 7/0045 430/905 |
| 6,136,502 A | * | 10/2000 | Satoshi ................ G03F 7/039 430/326 |
| 6,787,290 B2 | | 9/2004 | Nitta et al. |

FOREIGN PATENT DOCUMENTS

| | | |
|---|---|---|
| JP | H02-047109 A | 2/1990 |
| JP | H06-148889 A | 5/1994 |
| JP | H10-251315 A | 9/1998 |
| JP | H11-190904 A | 7/1999 |
| JP | 2000-066400 A | 3/2000 |
| JP | 2002-072480 A | 3/2002 |
| JP | 2004-144905 A | 5/2004 |
| JP | 2008-046594 A | 2/2008 |
| JP | 2009-080162 A | 4/2009 |
| WO | 2012/081619 A1 | 6/2012 |

OTHER PUBLICATIONS

International Search Report and Written Opinion (Application No. PCT/JP2020/037078) dated Dec. 15, 2020.
English translation of the International Preliminary Report on Patentability (Chapter 1) dated Apr. 14, 2022 (Application No. PCT/JP2020/037078).
Taiwanese Office Action (Application No. 109133765) dated Aug. 29, 2023 (with English translation) (14 pages).

* cited by examiner

*Primary Examiner* — John S Chu
(74) *Attorney, Agent, or Firm* — BURR PATENT LAW, PLLC

(57) ABSTRACT

A cross-linked polymer including a structure wherein at least a portion of phenolic hydroxyl groups in the polymer is protected by a group represented by the following formula (1):

$$* \underset{|}{\overset{|}{C}} - O - (CH_2CH_2O)_n - R^1 \quad (1)$$

wherein $R^1$ represents an alkyl group having 1 to 5 carbons and n represents an integer from 1 to 5; and * represents a bond part of the phenolic hydroxyl group to a residue other than a hydrogen atom, and a structure wherein at least a portion of phenolic hydroxyl groups in the polymer is protected by a group represented by the following formula (2):

$$* \underset{|}{\overset{|}{C}} - O - R^2 - O - \underset{|}{\overset{|}{C}} - * \quad (2)$$

wherein $R^2$ represents a divalent saturated hydrocarbon group having 2 to 17 carbons, containing an aromatic ring; and * represents a bond part of the phenolic hydroxyl group to a residue other than a hydrogen atom, and the polymers are cross-linked to each other.

7 Claims, No Drawings

CROSS-LINKED POLYMER FOR RESIST

BACKGROUND OF THE INVENTION

Field of the Invention

The present invention relates to a cross-linked polymer for a resist whose solubility against a developing solution varies by the action of an acid. More specifically, the present invention relates to a composition for a thick film resist comprising a cross-linked polymer which is useful for the thick film resist.

Background Art

Compositions for resists that are used in photolithography for manufacturing of semiconductors are those having base polymers of various novolac-type polymers or acrylic polymers, oxystyrene-based polymers such as hydroxystyrene, and the like. For example, the photolithography technique has been conventionally used in a wide variety of fields such as in manufacturing of a semiconductor integrated circuit such as LSI and a display surface of LPD, manufacturing of a circuit board such as a thermal head, for the purpose of forming microelements or carrying out microfabrication. A resist pattern of a high aspect ratio is required to be formed in good verticality to the wall surface in the field which requires a thick film process such as a magnetic head or a bump. However, there has been a problem that the above-described conventional resists had resolution properties or sensitivity which could not be maintained sufficiently and that the desired resist pattern cannot be obtained due to the problem of film light permeability caused by the film getting thicker. In order to solve these problems, there have been proposed methods to cross-link polymer chains with compounds that can be disconnected by acids, etc (see Patent Documents 1 to 4). The use of such cross-linked polymers will show sufficient strength with high molecular amount in the unexposed portion, and the exposed portion will have cross-links disconnected by the acid generated by the exposure and becomes a small structural unit and dissolve by the time developing is carried out by an alkaline developing solution. It is therefore considered the drop out unit of the exposed portion becomes smaller and the developing properties improve.

On the other hand, the cross-linked polymer cannot exhibit a sufficient dissolving ability against the alkaline developing solution when the cross-linked portion is not decomposed after exposure, and therefore, there is a need for a highly sensitive resin in which deprotection proceeds with small exposure energy in the film thickness.

PRIOR ART REFERENCES

Patent Document

Patent Document 1: JP2004-144905
Patent Document 2: JP2002-72480
Patent Document 3: JP2008-46594
Patent Document 4: JPH6-148889

SUMMARY OF THE INVENTION

Means for Solving the Problem

In order to solve the above-described problem, the present inventors have diligently studied and found a highly sensitive cross-linked polymer for a resist that is suitable for use in photolithography by protecting phenolic hydroxyl groups in a polymer with a hydrophilic acid-dissociable protective group having an oxyethylene group and with a protective group having a cross-linking structure, in a polymer for a resist whose solubility against a developing solution varies by the action of an acid, thereby completing the present invention.

That is, the present invention provides the following <1> to <7>.

<1> A cross-linked polymer for a resist whose solubility against a developing solution varies by the action of an acid, comprising a structure wherein at least a portion of phenolic hydroxyl groups in the polymer is protected by a group represented by the following formula (1):

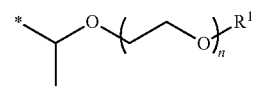

wherein $R^1$ represents an alkyl group having 1 to 5 carbons and n represents an integer from 1 to 5; and * represents a bond part of the phenolic hydroxyl group to a residue other than a hydrogen atom, and a structure wherein at least a portion of phenolic hydroxyl groups in the polymer is protected by a group represented by the following formula (2):

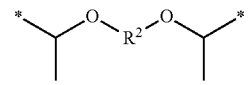

wherein $R^2$ represents a divalent saturated hydrocarbon group having 2 to 17 carbons, optionally containing an alicyclic ring group or a divalent hydrocarbon group having 6 to 17 carbons, containing an aromatic ring; and * represents a bond part of the phenolic hydroxyl group to a residue other than a hydrogen atom, and the polymers are cross-linked to each other.

<2> The cross-linked polymer for a resist according to <1>, wherein the polymer having phenolic hydroxyl groups is a polymer having a structural unit derived from p-hydroxystyrene or 4-hydroxy phenyl(meth)acrylate.

<3> The cross-linked polymer for a resist according to <1>, wherein the polymer having phenolic hydroxyl groups is a novolac polymer obtainable by condensation polymerization of phenols with aldehydes or ketones.

<4> The cross-linked polymer for a resist according to any one of <1> to <3>, wherein a ratio of protection of the phenolic hydroxyl groups by the group represented by the above-described formula (1) is from 20 to 60 mol % based on 100 mol % of the total phenols contained in the polymer.

<5> The cross-linked polymer for a resist according to any one of <1> to <4>, wherein a ratio of protection of the phenolic hydroxyl groups by the group represented by the above-described formula (2) is from 1 to 10 mol % based on 100 mol % of the total phenols contained in the polymer.

<6> The cross-linked polymer for a resist according to any one of <1> to <5>, wherein the polymer has the weight-average molecular weight of from 5,000 to 400,000.

<7> A composition for a thick film resist comprising the cross-linked polymer according to any one of <1> to <6>, a solvent, and an acid generator.

Effect of the Invention

According to the present invention, it is possible to provide a highly sensitive cross-linked polymer for a resist, and in particular a highly sensitive cross-linked polymer for a thick film resist which is used for photolithography.

MODE FOR CARRYING OUT THE INVENTION

<Polymer for Resist>

A polymer according the present invention can be used suitably for a resist whose solubility against a developing solution varies by the action of an acid.

At least a portion of the phenolic hydroxyl groups in the polymer of the present invention has a structure protected by the group represented by the following formula (1).

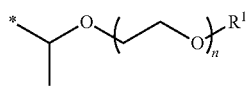
(1)

In formula (1), $R^1$ is an alkyl group having 1 to 5 carbons, preferably an alkyl group having 1 to 3 carbons, and more preferably a methyl group or an ethyl group. n is an integer from 1 to 5 and preferably an integer from 1 to 4. * represents a bond part of the phenolic hydroxyl group to a residue other than a hydrogen atom.

By protecting at least a portion of the phenolic hydroxyl groups in the polymer of the present invention by the groups represented by formula (1), it is possible to improve the sensitivity more than a conventional cross-linked type polymer for a resist.

For example, the groups represented by formula (1) include the following.

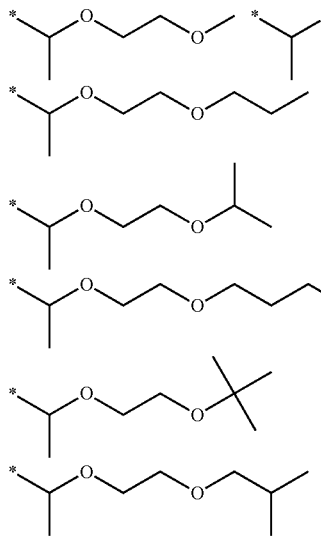

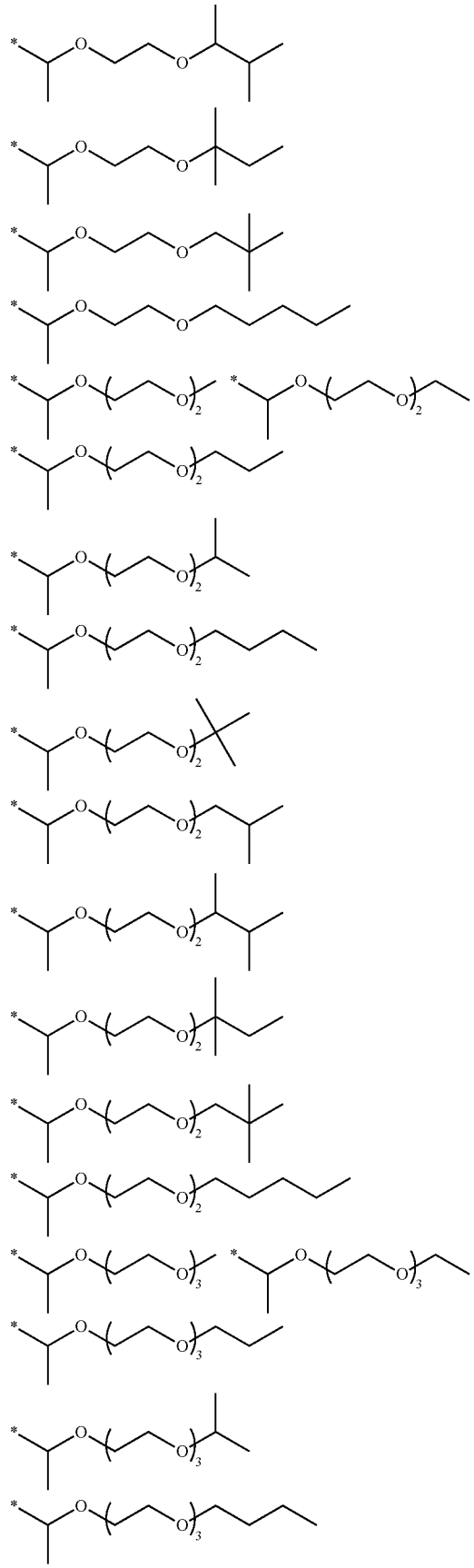

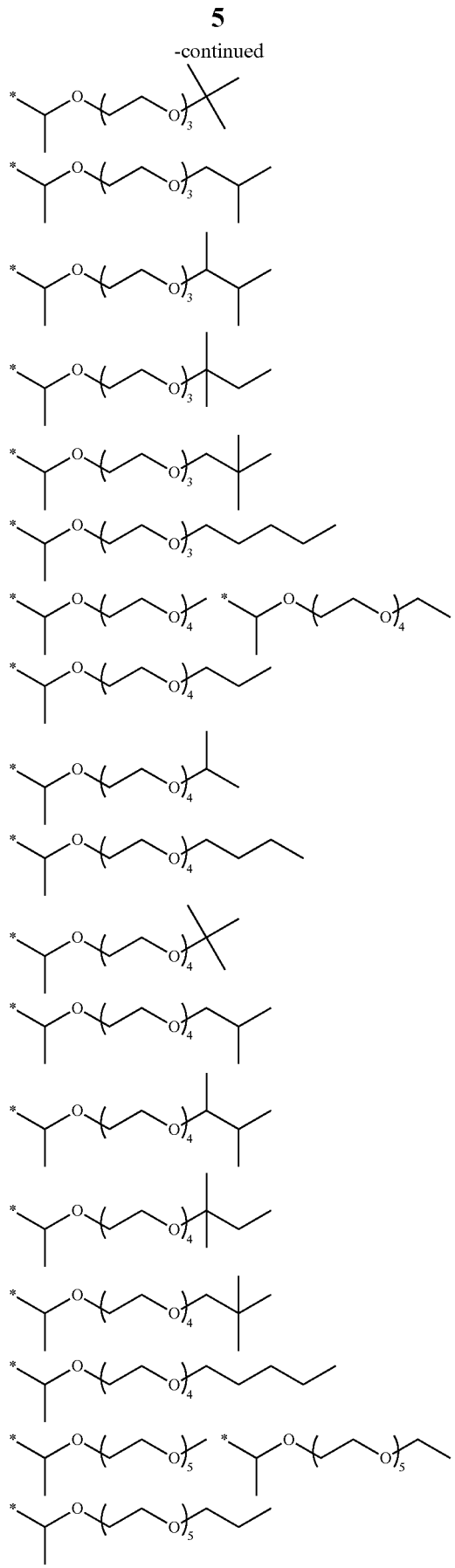
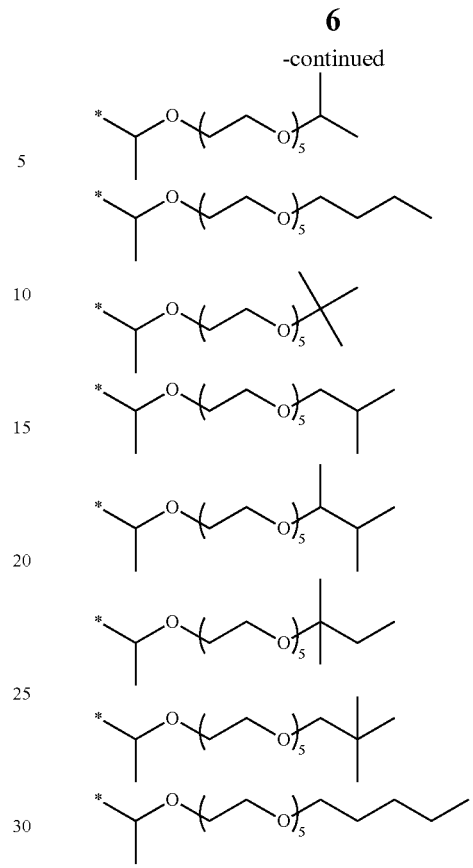

At least a portion of the phenolic hydroxyl groups in the polymer of the present invention has a structure in which it is further protected by a group represented by the following formula (2) and the polymers are cross-linked to each other. By having a cross-linking part which decompose by the action of such acid in the polymer of the present invention, the molecular weight of the polymer increases to reduce the solubility of the unexposed portion against an alkaline developing solution, while in the exposed portion, the cross-linking part decomposes to largely decrease the polymer molecule amount so that solubility against the developing agent improves, and as a result, it is possible to sufficiently improve sensitivity and developing contrast.

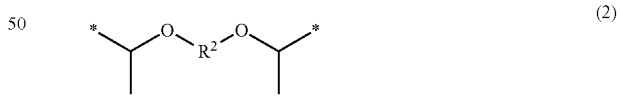

(2)

In formula (2), $R^2$ represents a divalent saturated hydrocarbon group having 2 to 17 carbons, optionally containing an alicyclic ring group or a divalent hydrocarbon group having 6 to 17 carbons, containing an aromatic ring, preferably a divalent saturated hydrocarbon group having 2 to 17 carbons, optionally containing an alicyclic ring group, and more preferably 1,4-cyclohexane dimethiene group, tricyclodecane dimethiene group. * represents a bond part of the phenolic hydroxyl group to a residue other than a hydrogen atom.

For example, the groups represented by formula (2) include the following.

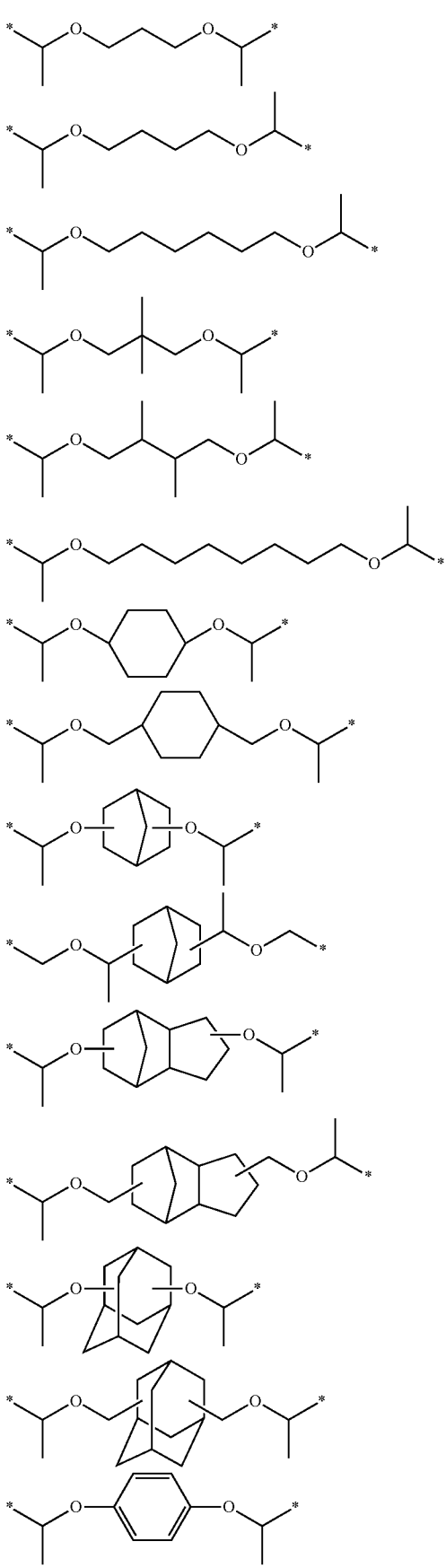

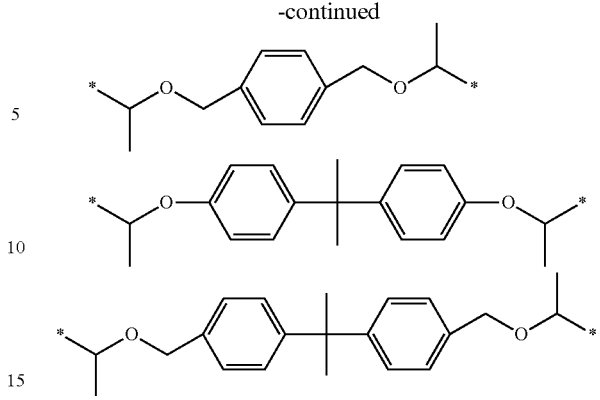

A preferred polymer of the present invention is one having a structure in which a portion of the phenolic hydroxyl groups in the polymer having a structural unit derived from p-hydroxystyrene or 4-hydroxyphenyl(meth) acrylate is protected by a group represented by formula (1) and which the polymers protected by groups represented by formula (2) are cross-linked to each other. As used herein, "meth(acrylate)" means "at least one of acrylate and methacrylate".

As a preferred embodiment of the present invention, a polymer is shown below having a structure in which a portion of the phenolic hydroxyl groups of (poly p-hydroxystyrene), i.e. a monopolymer of p-hydroxystyrene and in which the polymers protected by the group represented by formula (2) are cross-linked to each other.

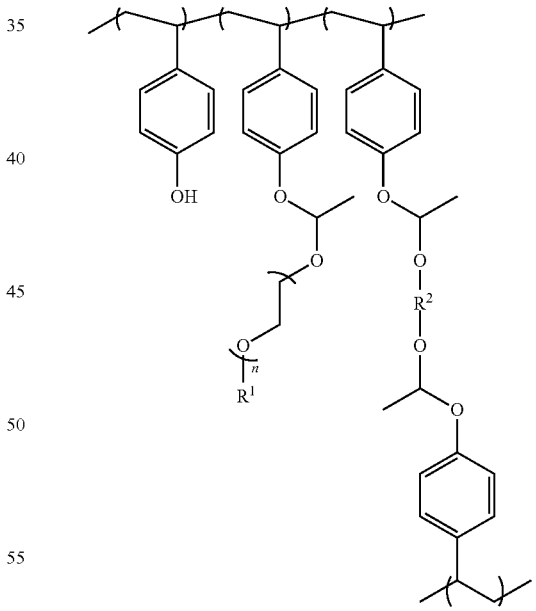

Preferred as a polymer of the present invention is also one that has a structure in which a portion of the phenolic hydroxyl groups in the novolac polymer obtainable from condensation polymerization of phenols with aldehydes or ketones is protected by groups represented by formula (1) and also by groups represented by formula (2) so that the polymers are cross-linked to each other.

The polymers of the present invention can introduce the protective groups represented by formula (1) by reacting the polymer having a phenolic hydroxyl group in the structure with vinyl ether represented by the following formula (3) (acetalization), in the presence of a solvent and an acid catalyst. One of the vinyl ether represented by the following formula (3) can be used, or a plurality thereof is also possible.

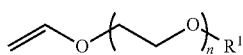
(3)

In formula (3), the definitions for $R^1$ and n and the preferred embodiments are the same as in formula (1).

For example, the groups represented by formula (3) include the following.

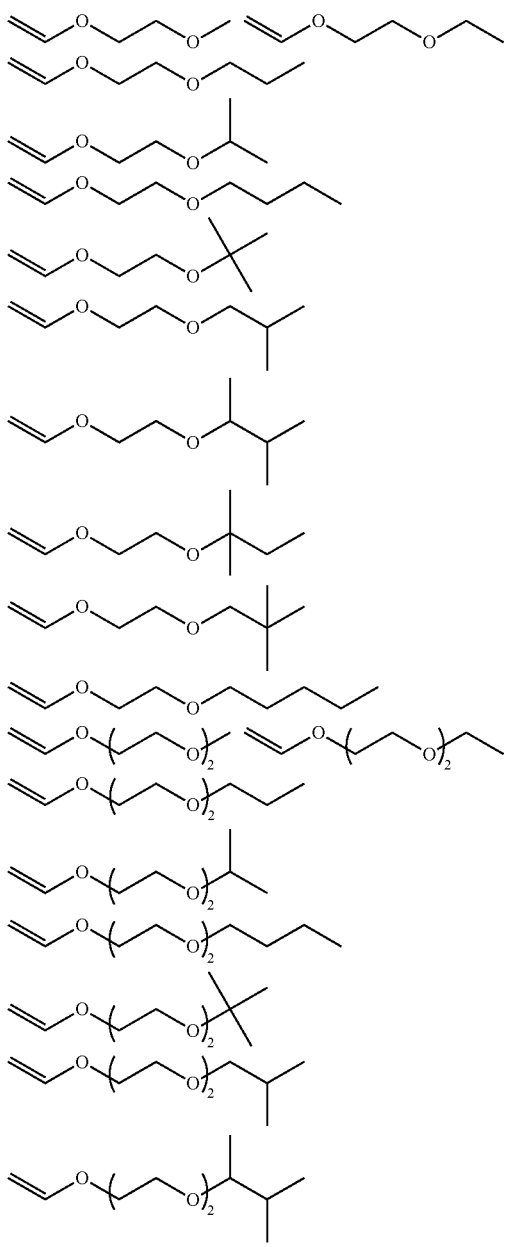

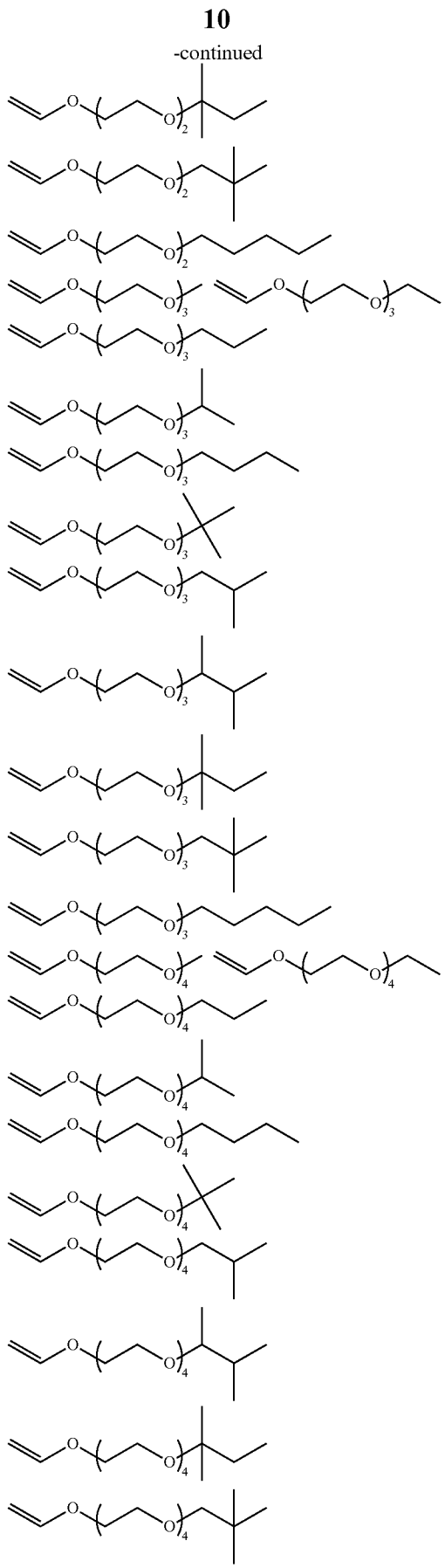

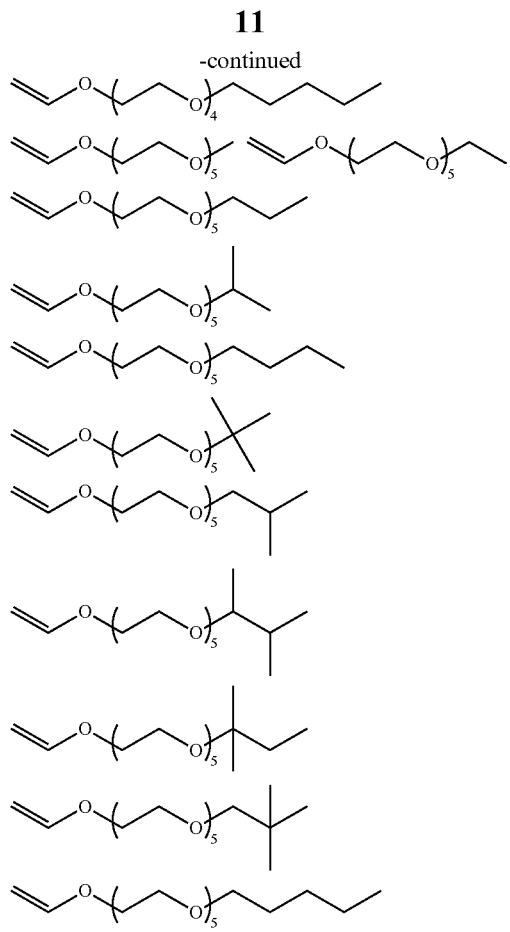

The polymers of the present invention can incorporate the protective groups represented by formula (2) and be cross-linked by reacting the polymer having phenolic hydroxyl groups in the structure with vinyl ether represented by the following formula (4), in the presence of a solvent and an acid catalyst (acetalization). One of the vinyl ether represented by the following formula (4) can be used, or a plurality thereof is also possible.

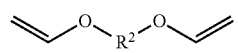   (4)

In formula (4), the definition for $R^2$ and the preferred embodiment is the same as in formula (2).

For example, the groups represented by formula (4) include the following.

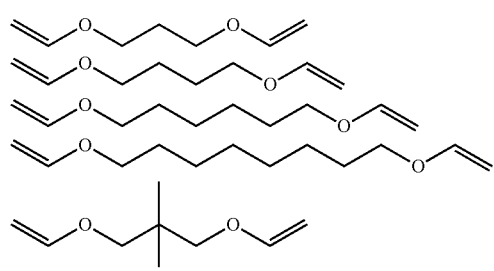
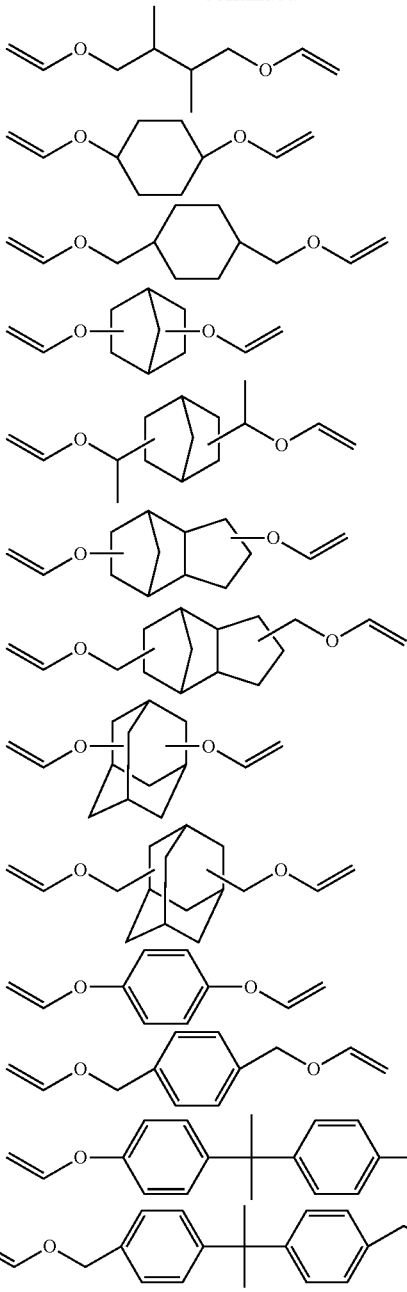

For example, the polymer of the present invention is obtainable by reacting a polymer having a structural unit derived from p-hydroxystyrene or 4-hydroxyphenyl(meth)acrylate with a vinyl ether represented by formulae (2) and (4) in the presence of a solvent and an acid catalyst (acetalization). Likewise, the polymer of the present invention is obtainable by reacting a novolac polymer obtainable from condensation of phenols with aldehydes or ketones, with a vinyl ether represented by formulae (2) and (4), in the presence of a solvent and an acid catalyst (acetalization). One or a plurality of each of the vinyl ethers represented by either formula (2) or (4) can be used.

Examples of the acid catalyst used for the acetalization reaction include inorganic acids such as sulfuric acid, nitric acid, hydrochloric acid, and phosphoric acid; carboxylic acids such as formic acid, acetic acid, butyric acid, and trifluoroacetic acid; sulfonic acids such as methane sulfonic acid, benzene sulfonic acid, and toluene sulfonic acid; and phosphonic acids such as methane phosphonic acid and benzene phosphonic acid. Among these, phosphoric acid or sulfonic acid is preferable from the viewpoint of suppressing the polymerization reaction of vinyl ether.

The amount of acidic catalyst used cannot be defined uniformly as it varies depending on the kind of acid to be used, and generally the amount is from 1 to 5000 ppm and preferably 1 to 2000 ppm, based on the reaction system. When the amount of the acidic catalyst used is within the above described scope, it is unlikely to cause side reaction such as polymerization reaction of vinyl ether, and it is easier to obtain a sufficient reaction rate.

The solvent used for the acetalization reaction may be any solvent that can stably dissolve a polymer having the raw material of phenolic hydroxyl groups, vinyl ether, an acid catalyst, and a product obtained by the acetalization reaction, specifically, esters such as methyl acetate, ethyl acetate, isopropyl acetate, propyl acetate, butyl acetate, methyl propionate, methyl lactate, and ethyl lactate; ether esters such as ethylene glycol monomethyl ether acetate, ethylene glycol monoethyl ether acetate, propylene glycol monomethyl ether acetate, and propylene glycol monoethyl ether acetate; ethers such as tetrahydrofuran, 1,4-dioxane, and ethylene glycol dimethyl ether; and aromatic hydrocarbons such as toluene and xylene, and these may be used alone or two or more is possible in combination.

The temperature of the acetalization reaction is preferably 25 to 120° C., preferably 30 to 100° C., and further preferably 30 to 80° C.

The rate of protection (introduction rate of the protective groups) of the phenolic hydroxyl groups in the polymer of the present invention by the group represented by formula (1) is preferably 20 to 60 mol %, more preferably 25 to 55 mol %, and further preferably 30 to 50 mol %, based on 100 mol % of the total number of phenols contained in the polymer. When the introduction rate of the protective groups is 20 mol % or more, the introduction rate of the protective groups can be adjusted easier, which then makes it easier to adjust the alkali dissolution rate, and when the introduction rate of the protective groups is 60 mol % or less, a desired resist pattern can be formed easier by adjusting the alkali dissolution rate.

The rate of protection (introduction rate of the protective groups) of the phenolic hydroxyl groups in the polymer of the present invention by the group represented by formula (2) is preferably 1 to 10 mol % and more preferably 2 to 8 mol %, based on 100 mol % of the total number of phenols contained in the polymer. When the introduction rate of the protective groups is within the above-described range, a desired resist pattern can be formed easier by adjusting the alkali dissolution rate.

After the acetalization reaction, the acid catalyst may be neutralized by adding a basic compound. In particular, examples of the basic compound include alkali metal compounds such as hydroxides of alkali metals such as sodium and potassium, carbonate and hydrogen carbonate; ammonia water and ammonia gas; amines such as trimethylamine and triethylamine; pyridines such as pyridine and methylpyridine; quaternary ammonium compounds such as tetraalkylammonium hydroxide; and basic ion-exchange resins, preferably amines, quaternary ammonium compounds, and more preferably amines.

The polymer of the present invention may contain other structures. As for the monomers that give the other structures, use can be made to various monomers used for known polymers for a resist for the purpose of adjusting solubility into the lithography solvent or the alkaline developing solution and substrate adhesiveness.

When the polymer having a phenolic hydroxyl group is a polymer having a structural unit derived from p-hydroxy styrene or 4-hydroxyphenyl(meth)acrylate, examples of the comonomer include styrene-based monomers derived from styrene, vinyl naphthalene, vinyl anthracene, and the like; various (meth) acrylic ester monomers derived from acrylic acid and methacrylic acid; and norbornene monomers derived from norbornene, tricyclododecene, tetracyclododecene and the like. Also, indene, acenaphthylene and the like can be copolymerized. However, when a monomer having an acid-dissociable group is used in the monomer, one must take precaution so that the acid-dissociable group is not eliminated by the action of the acid catalyst used in the acetalization reaction.

A polymer having a structural unit derived from p-hydroxystyrene or 4-hydroxyphenyl(meth)acrylate can be manufactured by known methods as disclosed in, for example, JPH02-047109, JPH10-251315, and WO2012/081619.

Further, poly p-hydroxystyrene is available from Maruzen Petrochemical Co., Ltd. or Nippon Soda Co., Ltd.

When a polymer having phenolic hydroxyl groups is a novolac polymer obtainable from condensation of phenols with aldehydes or ketones, it can be manufactured by known methods. That is, it can be manufactured by a method of reacting phenols with aldehydes or ketones in the presence of an acid catalyst. It is also possible to use commercially available novolac resins as there are various types available.

The weight average molecular weight (Mw) and the molecular weight distribution (Mw/Mn) of the cross-linked polymer can be appropriately set according to the application, without particular limitation. For example, the weight average molecular weight (Mw) is preferably 5,000 to 400,000, more preferably 7,000 to 100,000, further preferably 10,000 to 50,000, and further more preferably 20,000 to 40,000 from the viewpoint of exhibiting high molecular properties. The upper limit of the molecular weight distribution (Mw/Mn) is preferably 20 or less, more preferably 15 or less, further preferably 12 or less, further more preferably 10 or less, and the lower limit is preferably 2 or more, more preferably 3 or more, and further preferably 4 or more.

In the present invention, the weight average molecular weight (Mw) and the molecular weight distribution (Mw/Mn) of the crosslinked polymer are measured by GPC (gel permeation chromatography) and can be measured under the measurement conditions described below.

<Composition for Thick Film Resist>

The composition comprising the above-described polymer can be used for the purpose of, for example, a resist required in semi-conductor lithography. In particular, the composition can be preferably used for the purpose of forming a thick film resist having a film thickness of 1 μm or more and preferably a film thickness of 1 μm to 100 μm. The composition for a thick film resist according to the present invention comprises at least a polymer, a solvent, and an acid generator, and may further comprise an acid diffusion inhibitor, and the like.

The acid generator can be appropriately selected for use from those proposed as acid generators for chemically amplified resists thus far. Such examples include onium salts such as iodonium salts and sulfonium salts, diazomethanes such as oxime sulfonates, bisalkyl- or bisaryl sulfonyldiazomethanes, nitrobenzyl sulfonates, iminosulfonates, disulfones, and the like, among which onium salts are preferred. These may be used alone or two or more is possible in combination.

The acid diffusion inhibitor can be appropriately selected from those which have been proposed as an acid diffusion inhibitor for chemically amplified resists thus far. Examples thereof include nitrogen-containing organic compounds, with preference given to primary to tertiary alkylamines or hydroxyalkylamines. Especially, preference is given to tertiary alkylamines and tertiary hydroxyalkylamines, and among them, triethanolamine and triisopropanolamine are particularly preferred. These may be used alone, or two or more is possible in combination.

The solvent may be any solvent as long as it can dissolve each component constituting the resist composition to form a uniform solution, and any one of known solvents for forming a coating film can be used as one single solvent or a mixture of two or more solvents. Since the solvent is excellent in solubility, a solvent having at least one polar group selected from a ketone bond, an ester bond, an ether bond, and a hydroxy group is preferable. Among these, a solvent having a boiling point at normal pressure of 110° C. to 220° C. is particularly preferable because the solvent has an appropriate evaporation rate in baking after spin coating and has excellent film forming properties. Specific examples of such solvents include solvents having a ketone bond such as methyl isobutyl ketone, methyl isoamyl ketone, methyl amyl ketone, and cyclohexanone; solvents having an ether bond and a hydroxy group such as propylene glycol monomethyl ether (PGME) and propylene glycol monoethyl ether; solvents having an ether bond and an ester bond such as propylene glycol monomethyl ether acetate (PGMEA), propylene glycol monoethyl ether acetate, and ethyl 3-ethoxypropionate; solvents having an ester bond and a hydroxy group such as methyl lactate and ethyl lactate; and solvents having an ester bond such as γ-butyrolactone. Among them, PGMEA, PGME, γ-butyrolactone and ethyl lactate are preferable.

The resist composition can further contain as desired and as necessary, organic carboxylic acids or phosphorus oxoacids for the purpose of preventing the sensitivity of the acid generator from degradation and improving the shape of the resist pattern and the retention stability, additional resins for improving the performance of the resist film, surfactants, dissolution inhibitors, plasticizers, stabilizers, colorants, antihalation agents, dyes for improving coating properties, and other compounds commonly used as additives for a resist.

EXAMPLES

Hereinafter, the embodiments of the present invention shall be explained further with the aid of the Examples. However, the present invention shall not be limited by these Examples. Hereinafter, unless otherwise indicated, part is based on mass.

[Weight Average Molecular Weight/Molecular Weight Distribution]

The weight average molecular weight (Mw) and the molecular weight distribution (Mw/Mn) of polymers synthesized below were measured by GPC (gel permeation chromatography) using polystyrene as a standard. 0.02 g of the polymer after purification was dissolved in 1 ml of tetrahydrofuran to prepare a sample for analysis. The amount of sample injected into the device was 50 μl.

Measuring device: "HPLC-8320 GPC" manufactured by Tosoh Corporation
Detector: Differential refractive index (RI) detector Column: Shodex GPC LF804×3 (manufactured by Showa Denko K.K.)
Eluent: tetrahydrofuran
Flow rate: 1.0 mL/min
Temperature: 40° C.
Calibration curve: prepared using a polystyrene standard sample (manufactured by Tosoh Corporation)

[Polymerization Composition Ratio Introduction Rate of Protective Group]

Introduction rates of the protective groups of the polymers synthesized below were analyzed by $^{13}$C-NMR. 2.0 g of the purified polymer solution and 0.1 g of Cr(III)acetylacetonate were dissolved in 1.0 g of heavy acetone to prepare a sample for analysis.

Equipment: "AVANCE400" manufactured by Bruker
Nuclide: $^{13}$C
Measurement method: Inverse gate decoupling
Number of Integration: 6000
Measurement tube diameter: 10 mm φ

[Lithography Evaluation]

To 1.0 part of a polymer were added 0.1 part of a surfactant (MEGAFAC F477, manufactured by DIC) and 0.2 part of a photoacid generator (SP606, manufactured by ADEKA), and the mixture was dissolved in propylene glycol monomethyl ether acetate (hereinafter referred to as PGMEA) and adjusted to a concentration so that a film thickness of 10 μm can be obtained when it was spin-coated on a substrate. The mixed solution was filtered through a nylon filter having a pore diameter of 0.04 μm to obtain a resist composition.

The resist composition above was applied to a 6-inch silicon wafer substrate subjected to hexamethyldisilazane treatment (100° C.×60 seconds) at room temperature of 24° C. using a spin coater. After baking the substrate for 100° C.×60 seconds, the substrate was exposed to light by changing the exposure amount using an i-line light source, and then left at room temperature for 180 seconds. Thereafter, the substrate was set in a development speed measuring apparatus RDA-800, and developed at 23° C. with a 2.38 mass % tetramethylammonium hydroxide aqueous solution for 180 seconds, and the change over time of the resist film thickness during development at each exposure amount was measured. By analyzing the data, sensitivity Eth of the resist (the required exposure amount (mJ/cm$^2$) for setting the remaining film rate of the resist to 0%) was obtained. Eth indicates that the smaller the value, the higher is the sensitivity.

[Preparation Example 1] Preparation of Poly p-Hydroxystyrene (Poly PHS) Solution To an eggplant flask equipped with a thermometer, a cooling tube, and a stirring device were charged 1000 parts of poly p-hydroxystyrene (Maruka Linker M S-2P, manufactured by Maruzen Petrochemical Co., Ltd.) and 5000 parts of propylene glycol monomethylether acetate (hereinafter referred to as "PGMEA"), and the system was substituted with nitrogen while stirring, and the temperature was increased to 60° C. Next, PGMEA was concentrated with vacuum concentration to remove excess water and PGMEA to adjust the concentration to 30 wt %.

The obtained polymer had Mw=5,700 and Mw/Mn=2.03.

[Preparation Example 2] Preparation of Novolac Resin Solution

To an eggplant flask equipped with a thermometer, a cooling tube, and a stirring device were charged 272 parts of a novolac resin (PHENOLITE TD-2090 manufactured by DIC) and 1565 parts of PGMEA, and the mixture was concentrated under reduced pressure at 40° C. to remove excess water and PGMEA, and the concentration of the novolac resin was adjusted to 30 wt %.

The adjusted novolac resin had Mw=7,600 and Mw/Mn=4.70.

[Example 1] Poly PHS-MOVE35-CHDVE Protected Polymer

To an eggplant flask equipped with a thermometer, a cooling tube, and a stirring device were charged 206.8 parts of the 30 wt % poly-p-hydroxystyrene/PGMEA solution obtained in Preparation Example 1, 31.2 parts of PGMEA, and 0.8 parts of a PGMEA solution of 0.1 wt % methanesulfonic acid (hereinafter referred to as "MSA"), and the system was substituted with nitrogen while stirring and heated to 40° C. Next, a mixed solution of 19.6 parts of (2-methoxyethyl)vinyl ether (hereinafter referred to as "MOVE") and 18.4 parts of PGMEA was added dropwise over 30 minutes. Aging was performed for 2 hours, and a mixed solution of 3.0 parts of 1,4-cyclohexanedimethanol divinyl ether (manufactured by Nippon Carbide Industries, hereinafter referred to as "CHDVE") and 6.3 parts of PGMEA was added dropwise over 10 minutes. Aging was performed for 2 hours, and the reaction was stopped with a mixed solution of 0.008 part of triethylamine (hereinafter referred to as "TEA"; manufactured by Wako Pure Chemical Industries) and 25.0 parts of PGMEA. Thereafter, ion exchange was performed with 1.1 parts of Amberlist B20-HG•DRY (manufactured by Organo Corporation) on the column for about 6 hours. After the ion exchange, PGMEA was removed under reduced pressure at 40° C., and the concentration was adjusted to 50 wt %.

[Example 2] Poly PHS-MOVE25-CHDVE Protected Polymer

To an eggplant flask equipped with a thermometer, a cooling tube, and a stirring device were charged 331. 5 parts of the 30 wt % poly-p-hydroxystyrene/PGMEA solution obtained in Preparation Example 1, 54.2 parts of PGMEA, and 1.2 parts of a PGMEA solution of 0.1 wt % MSA, and the system was substituted with nitrogen while stirring and heated to 40° C. Next, a mixed solution of 20.7 parts of MOVE and 19.7 parts of PGMEA was added dropwise over 30 minutes. Aging was performed for 2 hours, and a mixed solution of 4.8 parts of CHDVE and 10.8 parts of PGMEA was added dropwise over 10 minutes. Aging was performed for 2 hours, and the reaction was stopped with a mixed solution of 0.013 part of TEA and 43.3 parts of PGMEA. Thereafter, ion exchange was performed on a column with 1.7 parts of Amberlist B20-HG•DRY (manufactured by Organo Corporation) for about 6 hours. After ion exchange, PGMEA was removed under reduced pressure at 40° C., and the concentration was adjusted to 50 wt %.

[Example 3] Poly PHS-MOVE45-CHDVE Protected Polymer

To an eggplant flask equipped with a thermometer, a cooling tube, and a stirring device were charged 329.9 parts of the 30 wt % poly-p-hydroxystyrene/PGMEA solution obtained in Preparation Example 1, 37.5 parts of PGMEA, and 1.2 parts of a PGMEA solution of 0.1 wt % MSA, and the system was substituted with nitrogen while stirring and heated to 40° C. Next, a mixed solution of 37.1 parts of MOVE and 37.1 parts of PGMEA was added dropwise over 30 minutes. Aging was performed for 2 hours, and a mixed solution of 4.8 parts of CHDVE and 9.1 parts of PGMEA was added dropwise over 10 minutes. Aging was performed for 2 hours, and the reaction was stopped with a mixed solution of 0.013 part of TEA and 36.5 parts of PGMEA. Thereafter, 1.7 parts of Amberlist B20-HG•DRY (manufactured by Organo Corporation) was subjected to ion exchange on a column for about 6 hours. After the ion exchange, PGMEA was removed under reduced pressure at 40° C., and the concentration was adjusted to 50 wt %.

[Example 4] Poly PHS-EOVE35-CHDVE Protected Polymer

To an eggplant flask equipped with a thermometer, a cooling tube, and a stirring device were charged 197.6 parts of the 30 wt % poly-p-hydroxystyrene/PGMEA solution obtained in Preparation Example 1, 25.4 parts of PGMEA, and 1.5 parts of a PGMEA solution of 0.1 wt % MSA, and the system was substituted with nitrogen while stirring and heated to 40° C. Next, a mixed solution of 20.8 parts of (2-ethoxyethyl)vinyl ether (hereinafter referred to as "EOVE") and 18.8 parts of PGMEA was added dropwise over 30 minutes. Aging was performed for 2 hours, and a mixed solution of 3.0 parts of CHDVE and 5.1 parts of PGMEA were added dropwise over 10 minutes. Aging was performed for 2 hours, and the reaction was stopped with a mixed solution of 0.015 part of TEA and 20.3 parts of PGMEA. Thereafter, ion exchange was carried out with 2.0 parts of Amberlist B20-HG•DRY (manufactured by Organo Corporation) for about 6 hours. After the ion exchange, PGMEA was concentrated under reduced pressure to adjust the concentration to 50 wt %.

[Example 5] Poly PHS-TEGVE35-CHDVE Protected Polymer

To an eggplant flask equipped with a thermometer, a cooling tube, and a stirring device were charged 195. 1 parts of the 30 wt % poly-p-hydroxystyrene/PGMEA solution obtained in Preparation Example 1, 11.8 parts of PGMEA and 1.4 parts of a PGMEA solution of 0.1 wt % MSA, and the system was substituted with nitrogen while stirring and heated to 40° C. Next, a mixed solution of 33.7 parts of 2-(2-(2-methoxyethoxy)ethoxy)ethyl vinyl ether (hereinafter referred to as "TEGVE") and 31.8 parts of PGMEA was added dropwise over 30 minutes. Aging was performed for 2 hours, and a mixed solution of 3.0 parts of CHDVE and 2.4 parts of PGMEA were added dropwise over 10 minutes. Aging was performed for 2 hours, and the reaction was stopped with a mixed solution of 0.015 part of TEA and 9.5 parts of PGMEA. Thereafter, ion exchange was performed with 2.0 parts of Amberlist B20-HG•DRY (manufactured by Organo Corporation) for about 6 hours. After the ion exchange, PGMEA was concentrated under reduced pressure to adjust the concentration to 50 wt %.

[Example 6] Novolak-MOVE35-CHDVE Protected Polymer

To an eggplant flask equipped with a thermometer, a cooling tube, and a stirring device were charged 193. 4 parts of the novolak resin solution obtained in Preparation Example 2, 26.7 parts of PGMEA, and 0.8 parts of a PGMEA solution of 0.1 wt % MSA, and the system was substituted with nitrogen while stirring and heated to 40° C. Next, a mixed solution of 20.6 parts of MOVE and 19.6 parts of PGMEA was added dropwise over 30 minutes. Aging was performed for 2 hours, and a mixed solution of 3.4 parts of CHDVE and 5.3 parts of PGMEA was added dropwise over 10 minutes. Aging was performed for 2 hours, and the reaction was stopped with a mixed solution of 0.009 part of TEA and 21.4 parts of PGMEA. Thereafter, ion exchange was performed with 1.1 parts of Amberlist B20-HG•DRY (manufactured by Organo Corporation) for about 6 hours. After the ion exchange, PGMEA was concentrated under reduced pressure to adjust the concentration to 50 wt %.

[Comparative Example 1] Poly PHS-EVE35-CHDVE Protected Polymer

To an eggplant flask equipped with a thermometer, a cooling tube, and a stirring device were charged 325. 2 parts of the 30 wt % poly-p-hydroxystyrene/PGMEA solution obtained in Preparation Example 1, 60.5 parts of PGMEA, and 1.2 parts of a PGMEA solution of 0.1 wt % MSA, and the system was substituted with nitrogen while stirring and heated to 40° C. Next, a mixed solution of 21.5 parts of ethyl vinyl ether (hereinafter referred to as "EVE") and 12.0 parts of PGMEA was added dropwise over 30 minutes. A mixed solution of 5.0 parts of CHDVE and 5.3 parts of PGMEA was added dropwise over 10 minutes. Aging was performed for 1 hour, and the reaction was stopped with a mixed solution of 0.013 part of TEA and 48.4 parts of PGMEA. After that, ion exchange was performed with 2.5 parts of Amberlist B20-HG•DRY (manufactured by Organo Corporation) for about 6 hours. After the ion exchange, PGMEA was concentrated under reduced pressure to adjust the concentration to 50 wt %.

[Comparative Example 2] Poly PHS-CHVE35-CHDVE Protected Polymer

To an eggplant flask equipped with a thermometer, a cooling tube, and a stirring device were charged 197. 2 parts of the 30 wt % poly-p-hydroxystyrene/PGMEA solution obtained in Preparation Example 1, 22.3 parts of PGMEA, and 1.5 parts of a PGMEA solution of 0.1 wt % MSA, and the system was substituted with nitrogen while stirring and heated to 40° C. Next, a mixed solution of 23.8 parts of cyclohexylvinyl ether (hereinafter referred to as "CHVE"; manufactured by Maruzen Petrochemical Co., Ltd.) and 21.3 parts of PGMEA was added dropwise over 30 minutes. After aging for 2 hours, a mixed solution of 3.4 parts of CHDVE and 5.3 parts of PGMEA was added dropwise over 10 minutes. After aging for 2 hours, the reaction was stopped with a mixed solution of 0.015 part of TEA and 18.2 parts of PGMEA. Thereafter, ion exchange was performed with 2.0 parts of Amberlist B20-HG•DRY (manufactured by Organo Corporation) for about 6 hours. After the ion exchange, PGMEA was concentrated under reduced pressure to adjust the concentration to 50 wt %.

[Comparative Example 3] Poly PHS-DHP35-CHDVE Protected Polymer

To an eggplant flask equipped with a thermometer, a cooling tube, and a stirring device were charged 200.9 parts of the 30 wt % poly-p-hydroxystyrene/PGMEA solution obtained in Preparation Example 1, 30.9 parts of PGMEA, and 0.3 part of a PGMEA solution of 1.0 wt % MSA, and the system was substituted with nitrogen while stirring and heated to 40° C. Next, a mixed solution of 15.4 parts of dihydropyran (hereinafter referred to as "DHP") and 14.5 parts of PGMEA was added dropwise over 30 minutes. Aging was performed for 4 hours, and a mixed solution of 3.3 parts of CHDVE and 6.2 parts of PGMEA was added dropwise over 10 minutes. Aging was performed for 30 minutes, and the reaction was stopped with a mixed solution of 0.015 part of TEA and 18.2 parts of PGMEA. Thereafter, ion exchange was performed with 2.7 parts of Amberlist B20-HG•DRY (manufactured by Organo Corporation) for about 6 hours. After the ion exchange, PGMEA was concentrated under reduced pressure to adjust the concentration to 50 wt %.

[Comparative Example 4] Poly PHS-MOVE35 Protected Polymer

To an eggplant flask equipped with a thermometer, a cooling tube, and a stirring device were charged 2211 parts of the 30 wt % poly-p-hydroxystyrene/PGMEA solution obtained in Preparation Example 1, 350 parts of PGMEA, and 8.5 parts of a PGMEA solution of 0.1 wt % MSA, and the system was substituted with nitrogen while stirring and heated to 40° C. Next, a mixed solution of 214 parts of MOVE and 198 parts of PGMEA was added dropwise over 30 minutes. Aging was performed for 2 hours, and the reaction was stopped with 351 parts of PGMEA. After that, ion exchange was performed on the column with 7.7 parts of Amberlist B20-HG•DRY (manufactured by Organo Corporation) for about 6 hours. After the ion exchange, PGMEA was removed under reduced pressure at 40° C., and the concentration was adjusted so as to be 50 wt %.

The weight-average molecular weight (Mw), the molecular weight distribution (Mw/Mn), and the introduction rate of the protective groups of the polymers obtained in Examples and Comparative Examples were measured, and the lithographic evaluation results (Eth) are shown in Table 1. The protection rate of the phenolic hydroxyl groups was confirmed as being quantitatively progressing by $^{13}$C-NMR. Note that, since the $^{13}$C-NMR cannot quantitate the unit which has been protected by monovinyl ether and the unit which has been protected by divinyl ether separately, each of the introduction rate is expressed with values calculated based on the feed amount of the raw material.

TABLE 1

| | Polymer | | | Introduction rate of the protective groups (mol %)[X2] | | | | | | | Eth |
|---|---|---|---|---|---|---|---|---|---|---|---|
| | Kind | Mw | Mw/Mn | MOVE | EOVE | TEGVE | EVE | CHVE | DHP | CHDVE | mJ/cm |
| Ex 1 | Poly PHS | 25,800 | 5.97 | 35 | 0 | 0 | 0 | 0 | 0 | 3 | 30 |
| Ex 2 | Poly PHS | 24,000 | 5.34 | 25 | 0 | 0 | 0 | 0 | 0 | 3 | 7 |
| Ex 3 | Poly PHS | 23,800 | 5.21 | 45 | 0 | 0 | 0 | 0 | 0 | 3 | 7 |
| Ex 4 | Poly PHS | 25,000 | 5.46 | 0 | 35 | 0 | 0 | 0 | 0 | 3 | 12 |
| Ex 5 | Poly PHS | 27,300 | 5.58 | 0 | 0 | 35 | 0 | 0 | 0 | 3 | <5 |
| Ex 6 | Novolac | 23,300 | 11.85 | 35 | 0 | 0 | 0 | 0 | 0 | 3 | <5 |

TABLE 1-continued

| | Polymer | | | Introduction rate of the protective groups (mol %)[X2] | | | | | | | Eth |
|---|---|---|---|---|---|---|---|---|---|---|---|
| | Kind | Mw | Mw/Mn | MOVE | EOVE | TEGVE | EVE | CHVE | DHP | CHDVE | mJ/cm |
| Comp. Ex 1 | Poly PHS | 23,600 | 5.49 | 0 | 0 | 0 | 35 | 0 | 0 | 3 | 47 |
| Comp. Ex 2 | Poly PHS | 23,100 | 4.96 | 0 | 0 | 0 | 0 | 35 | 0 | 3 | 512 |
| Comp. Ex 3 | Poly PHS | 35,000 | 7.72 | 0 | 0 | 0 | 0 | 0 | 35 | 3 | >1,000 |
| Comp. Ex 4 | Poly PHS | 6,400 | 2.13 | 35 | 0 | 0 | 0 | 0 | 0 | 0 | —[X1] |

[X1] The result was unable to be measured since sensitivity was too high.
[X2] Calculated based on the feed amount of the raw material, taking into consideration the water content contained in the raw material.

The cross-linked polymers protected with specific hydrophilic acid-dissociable and cross-linked protecting groups of Examples 1 to 6 had substantially improved sensitivity compared to the polymers protected with the conventional hydrophobic acid-dissociable and cross-linked protecting groups of Comparative Examples 1 to 3. In addition, the polymer of Comparative Example 4 had no cross-linked protecting group and was protected only with the hydrophilic acid-dissociable protecting group, and therefore, it was difficult to handle in photolithography because the sensitivity was too good.

The invention claimed is:

1. A cross-linked polymer for a resist whose solubility against a developing solution varies by the action of an acid, comprising a structure wherein at least a portion of phenolic hydroxyl groups in the polymer is protected by a group represented by the following formula (1):

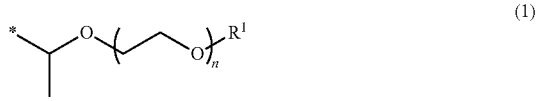

(1)

wherein R¹ represents an alkyl group having 1 to 5 carbons and n represents an integer from 1 to 5; and * represents a bond part of the phenolic hydroxyl group to a residue other than a hydrogen atom, and a structure wherein at least a portion of phenolic hydroxyl groups in the polymer is protected by a group represented by the following formula (2):

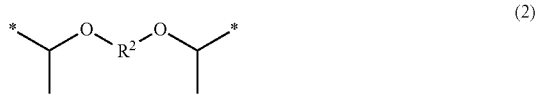

(2)

wherein R² represents a divalent saturated hydrocarbon group having 2 to 17 carbons, optionally containing an alicyclic ring group or a divalent hydrocarbon group having 6 to 17 carbons, containing an aromatic ring; and * represents a bond part of the phenolic hydroxyl group to a residue other than a hydrogen atom, and the polymers are cross-linked to each other.

2. The cross-linked polymer for a resist according to claim 1, wherein
the polymer having phenolic hydroxyl groups is a polymer having a structural unit derived from p-hydroxystyrene or 4-hydroxy phenyl(meth)acrylate.

3. The cross-linked polymer for a resist according to claim 1, wherein
the polymer having phenolic hydroxyl groups is a novolac polymer obtainable by condensation polymerization of phenols with aldehydes or ketones.

4. The cross-linked polymer for a resist according to claim 1, wherein
a ratio of protection of the phenolic hydroxyl groups by the group represented by the above-described formula (1) is from 20 to 60 mol % based on 100 mol % of the total phenols contained in the polymer.

5. The cross-linked polymer for a resist according to claim 1, wherein
a ratio of protection of the phenolic hydroxyl groups by the group represented by the above-described formula (2) is from 1 to 10 mol % based on 100 mol % of the total phenols contained in the polymer.

6. The cross-linked polymer for a resist according to claim 1, wherein
the polymer has the weight-average molecular weight of from 5,000 to 400,000.

7. A composition for a thick film resist comprising at least the cross-linked polymer according to claim 1, a solvent, and an acid generator.

* * * * *